(12) United States Patent
Solhusvik

(10) Patent No.: US 8,687,085 B2
(45) Date of Patent: Apr. 1, 2014

(54) METHOD AND APPARATUS FOR VERIFICATION OF IMAGING SYSTEMS

(75) Inventor: Johannes Solhusvik, Haslum (NO)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 13/371,258

(22) Filed: Feb. 10, 2012

(65) Prior Publication Data

US 2013/0027574 A1   Jan. 31, 2013

Related U.S. Application Data

(60) Provisional application No. 61/511,454, filed on Jul. 25, 2011.

(51) Int. Cl.
*H04N 5/228* (2006.01)
*H04N 5/235* (2006.01)
*H04N 9/64* (2006.01)
*H04N 5/222* (2006.01)

(52) U.S. Cl.
USPC ............. 348/222.1; 348/230.1; 348/244; 348/333.04

(58) Field of Classification Search
USPC .............. 348/222.1, 230.1, 244, 333.04
See application file for complete search history.

(56) References Cited

U.S. PATENT DOCUMENTS

| 5,334,829 | A | 8/1994 | Ueno et al. |
| 7,027,096 | B2 * | 4/2006 | Miyashita et al. ............ 348/372 |
| 2008/0158363 | A1 | 7/2008 | Myers |
| 2010/0030426 | A1 * | 2/2010 | Okita ............................ 701/41 |
| 2011/0311023 | A1 | 12/2011 | Sagoh et al. |

FOREIGN PATENT DOCUMENTS

WO    2005073682    8/2005

\* cited by examiner

*Primary Examiner* — Twyler Haskins
*Assistant Examiner* — Padma Haliyur
(74) *Attorney, Agent, or Firm* — Treyz Law Group; Louis R. Levenson

(57) ABSTRACT

Imaging systems may be provided with image sensors and verification circuitry. Verification circuitry may be configured to continuously verify proper operation of the image sensor during operation. Verification circuitry may include one or more heating elements formed on a common substrate with image pixels of the image sensor. Verification data may be generated by powering on the heating elements and collecting charges generated in image pixels of the image sensor in response to heat generated by the powered heating element. Heat image charges may be read out using the same readout circuitry that is used to readout imaging data generated in response to incoming light. Heat image data may be used to verify proper operation of all components of an imaging system. Based on a comparison of the verification data with a predetermined standard, an imaging system may continue to operate normally or corrective action may be taken.

17 Claims, 9 Drawing Sheets

METHOD AND APPARATUS FOR VERIFICATION OF IMAGING SYSTEMS

This application claims the benefit of provisional patent application No. 61/511,454, filed Jul. 25, 2011, which is hereby incorporated by reference herein in its entirety.

BACKGROUND

This relates generally to imaging devices, and more particularly, to imaging devices with verification circuitry.

Image sensors are commonly used in electronic devices such as cellular telephones, cameras, and computers to capture images. In some situations, it may be desirable to occasionally verify that the components of an image sensor are operating properly before, during, and/or after operation of an electronic device.

It can be difficult to generate repeatable verification signals that test the components of an imaging system. Providing a system or device with a separate and dedicated verification system can add additional cost and complexity to the manufacturing and assembly of the system or device.

It would therefore be desirable to be able to provide improved imaging systems with system verification capabilities.

DETAILED DESCRIPTION

Figure 1:
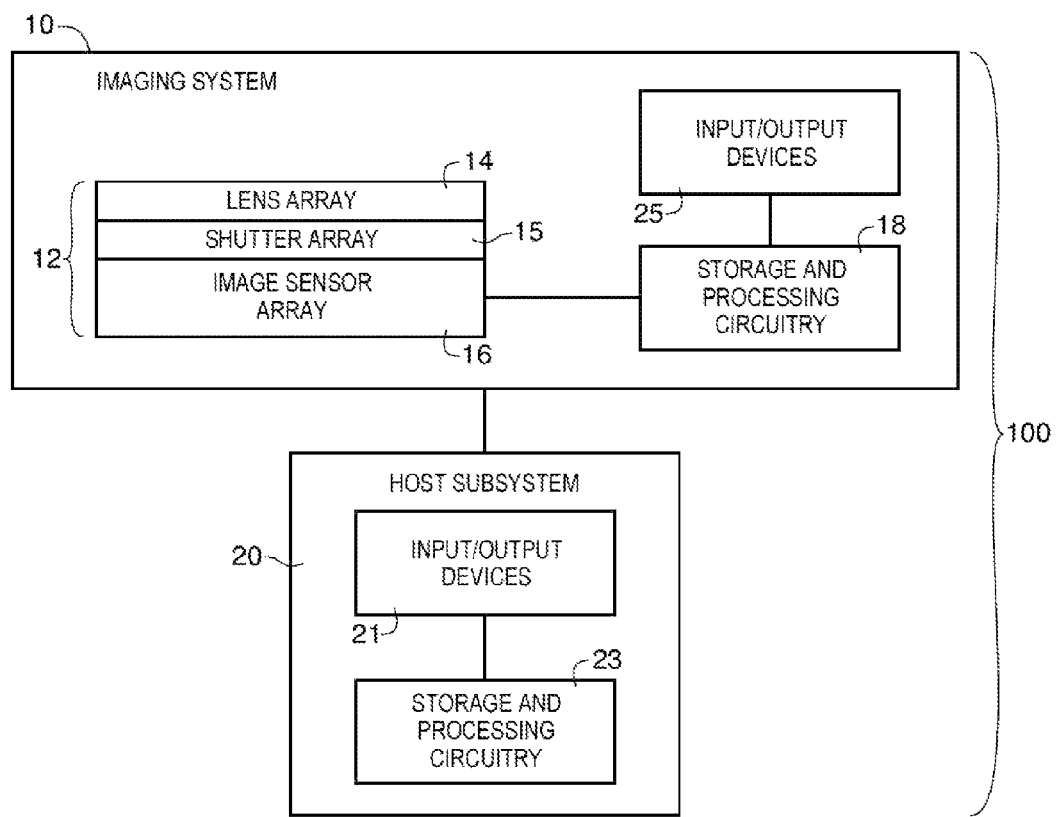
FIG. 1 is a diagram of an illustrative imaging system that contains a camera module with an array of lenses and an array of corresponding image sensors in accordance with an embodiment of the present invention.

Imaging systems having digital camera modules are widely used in electronic devices such as digital cameras, computers, cellular telephones, and other electronic devices. A digital camera module may include one or more image sensors that gather incoming light to capture an image.

In some situations, imaging systems may form a portion of a larger system such as a surveillance system or a safety system for a vehicle (e.g., an automobile, a bus, or any other vehicle). In a vehicle safety system, images captured by the imaging system may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane drift avoidance system), etc. In at least some instances, an imaging system may form part of a semi-autonomous or autonomous self-driving vehicle. Such imaging systems may capture images and detect nearby vehicles using those images. If a nearby vehicle is detected in an image, the vehicle safety system may sometimes operate a warning light, a warning alarm, or may operate active braking, active steering, or other active collision avoidance measures. A vehicle safety system may use continuously captured images from an imaging system having a digital camera module to help avoid collisions with objects (e.g., other automobiles or other environmental objects), to help avoid unintended drifting (e.g., crossing lane markers) or to otherwise assist in the safe operation of a vehicle during any normal operation mode of the vehicle.

Vehicle safety standards may require that the proper operation of any component of a vehicle safety system (including imaging system components) be verified before, during, and/or after operation of the vehicle. Verification operations for imaging system components may be performed by an imaging system prior to and/or after operation of a vehicle (e.g., upon startup and/or shutdown of the imaging system). In these verification operations, concurrent operation of the imaging system may not be required. However, it may be desirable to continuously monitor the status of imaging system components during operation of the imaging system, particularly in situations in which vehicle safety may be influenced by the quality of imaging data provided by the imaging system. Imaging systems may be provided having this type of on-the-fly verification capability.

Image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds, thousands, or millions of pixels (e.g., megapixels). An image sensor may include verification circuitry for verifying the correct operation of the image sensor. For example, in situations in which images captured by the image sensors are used as input to an active control system for a vehicle, verification circuitry in the image sensor may be configured to generate verification image data and compare the verification image data with an expected result so that incorrect image sensor data is not input into the active control system.

Verification image data may be compared with a predetermined standard stored in the imaging system or stored on additional circuitry that is external to the imaging system. The predetermined standard may be a mathematically determined threshold, may sometimes be referred to as a "golden" standard image, may be captured during manufacturing of the imaging system or at another suitable time (e.g., during startup or shutdown of the imaging system), and may include one or more mathematically or experimentally determined ranges to which verification image data may be compared.

Based on the result of the comparison of the verification image data with the predetermined standard, an imaging system may be disabled (e.g., if the result is outside the predetermined range), may continue to operate normally (e.g., if the result is within the predetermined range). In some arrangements, the imaging system may remain operation but an indicator may be presented to users to inform the users that the imaging system needs further inspection and/or repair (e.g., the imaging system may present a "check imaging system" indication when the results of verification operations indicate a potential problem in the operation of the imaging system).

FIG. 1 is a diagram of an illustrative imaging and response system including an imaging system that uses an image sensor to capture images. Imaging and response system 100 of FIG. 1 may be a vehicle safety system (e.g., an active braking system, an active steering system, a parking assist system, a collision warning system or other vehicle safety system), may be a surveillance system, or may be an electronic device such as a camera, a cellular telephone, a video camera, or other electronic device that captures digital image data.

As shown in FIG. 1, system 100 may include an imaging system such as imaging system 10 and host subsystems such as host subsystem 20. Imaging system 10 may include camera module 12, control circuitry such as storage and processing circuitry 18 and, if desired, input/output devices such as input/output devices 25.

Camera module 12 may be used to convert incoming light into electric charges and eventually into digital image data. Camera module 12 may include an array of lenses 14 and a corresponding array of image sensors 16. During image capture operations, light from a scene may be focused onto each image sensor in image sensor array 16 using a respective lens in lens array 14. Camera module 12 may include an array of mechanical shutters such as shutter array 15 interposed between lens array 14 and image sensor array 16. Each shutter in shutter array 15 may be alternately closed or opened in order to block light from reaching a corresponding image sensor 16 or allow light to reach the corresponding image sensor 16 respectively. Lenses 14, shutters 15, and image sensors 16 may be mounted in a common package and may provide image data to storage and processing circuitry 18.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment such as host subsystem 20 using wired and/or wireless communications paths coupled to processing circuitry 18. Circuitry 18 may be configured to operate (e.g., open or close) one or more shutters in shutter array 15.

There may be any suitable number of lenses in lens array 14 and any suitable number of image sensors in image sensor array 16. Lens array 14 may, as an example, include N*M individual lenses arranged in an N×M array. The values of N and M may each be equal or greater than one, may each be equal to or greater than two, may exceed 10, or may have any other suitable values. Image sensor array 16 may contain a corresponding N×M array of individual image sensors. The image sensors of image sensor array 16 may be formed on one or more separate semiconductor substrates. With one suitable arrangement, which is sometimes described herein as an example, the image sensors are formed on a common semiconductor substrate (e.g., a common silicon image sensor integrated circuit die).

Each image sensor may be identical or there may be different types of image sensors in a given image sensor array integrated circuit. Each image sensor may be a Video Graphics Array (VGA) sensor with a resolution of 480×640 sensor pixels (as an example). Other types of sensor pixels may also be used for the image sensors if desired. For example, images sensors with greater than VGA resolution sensor (e.g., high-definition image sensors) or less than VGA resolution may be used, image sensor arrays in which the image sensors are not all identical may be used, etc.

In some modes of operation, all of the sensors on array 16 may be active. In other modes of operation, only a subset of the image sensors may be used. Other sensors may be inactivated to conserve power (e.g., their positive power supply voltage terminals may be taken to a ground voltage or other suitable power-down voltage and their control circuits may be inactivated or bypassed).

Image sensors of image sensor array 16 may be provided with color filters such as red filters, blue filters, and green filters. Each filter may form a color filter layer that covers the image pixels of the image sensor pixel array of a respective image sensor in the array. Other filters such as infrared-blocking filters, filters that block visible light while passing infrared light, ultraviolet-light blocking filters, white color filters, etc. may also be used. In an array with numerous image sensors, some of the image sensors may have red filters, some may have blue color filters, some may have green color filers, some may have patterned color filters (e.g., Bayer pattern filters, etc.), some may have infrared-blocking filters, some may have ultraviolet light blocking filters, or some may be visible-light-blocking-and-infrared-passing filters.

Storage and processing circuitry 18 may convey data (e.g., acquired image data, verification image data, or a result of a verification test) to host subsystem 20. Host subsystem 20 may include an active control system that delivers control signals for controlling vehicle functions such as braking or steering to external devices. Host subsystem 20 may include processing software for detecting objects in images, detecting motion of objects between image frames, determining distances to objects in images, filtering or otherwise processing images provided by imaging system 10. Host subsystem 20 may include a warning system configured to disable imaging system 10 and/or generate a warning (e.g., a warning light on an automobile dashboard, an audible warning or other warning) in the event that verification circuitry associated with one of the image sensors in image sensor array 16 determines that the image sensor is not functioning properly.

If desired, system 100 may provide a user with numerous high-level functions. In a computer or advanced cellular telephone, for example, a user may be provided with the ability to run user applications. To implement these functions, host subsystem 20 and/or imaging system 10 of system 100 may have input/output devices such as input/output devices 25 and 21 respectively. Input/output devices 25 and 21 may include devices such as keypads, input-output ports, joysticks, and displays coupled to storage and processing circuitry 18 and 23 respectively. Storage and processing circuitry 23 of host subsystem 20 may include volatile and nonvolatile memory (e.g., random-access memory, flash memory, hard drives, solid state drives, etc.). Storage and processing circuitry 23 may also include microprocessors, microcontrollers, digital signal processors, application specific integrated circuits, etc.

During operation of imaging system 10, camera module 12 may continuously capture and provide image frames to host subsystems such as host subsystem 20. During image capture operations, verification circuitry associated with one or more of the image sensors of image sensor array 16 may be occasionally operated (e.g., following each image frame capture, following every other image frame capture, following every fifth image frame capture, during a portion of an image frame capture, etc.). Images captured when verification circuitry is operated may include verification image data containing verification information. Verification image data may be provided to storage and processing circuitry 18 and/or storage and processing circuitry 23. Storage and processing circuitry 18 may be configured to compare the verification image data to a predetermined standard data set stored on storage and processing circuitry 18. Following the comparison, storage and processing circuitry 18 may send status information (e.g., the result of the comparison, or a coded fault signal) or other verification information to host subsystem 20.

Figure 2:
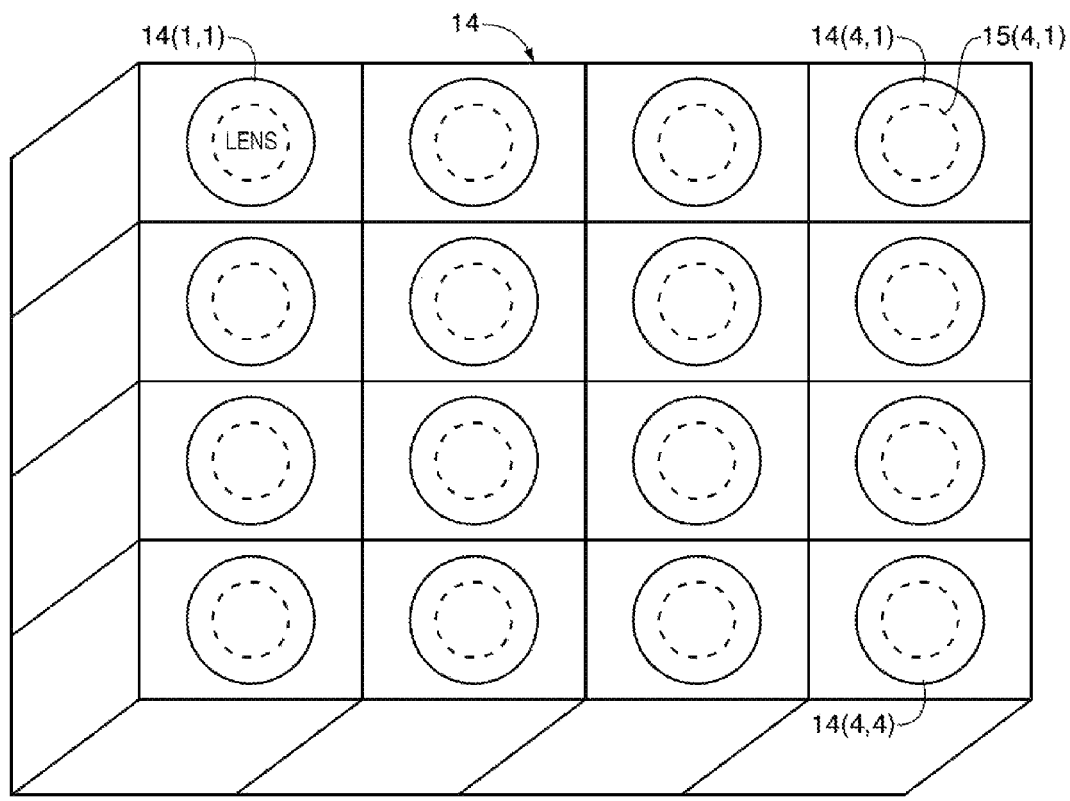
FIG. 2 is a perspective view of an illustrative camera module having an array of lenses in accordance with an embodiment of the present invention.

FIG. 2 is a perspective view of an illustrative camera module having an array 14 of lenses (e.g., lenses such as lenses 14(1,1), 14(4,1) and 14(4,4)). The array of lenses may, for example, be a rectangular array having rows and columns of lenses. The lenses may all be equally spaced from one another or may have different spacings. There may be any suitable number of lenses 14 in the array. In the FIG. 2 example, there are four rows and four columns of lenses. Each lens may have an associated shutter in shutter array 15 (e.g., mechanical shutters such as shutter 15(4,1)).

Figure 3:
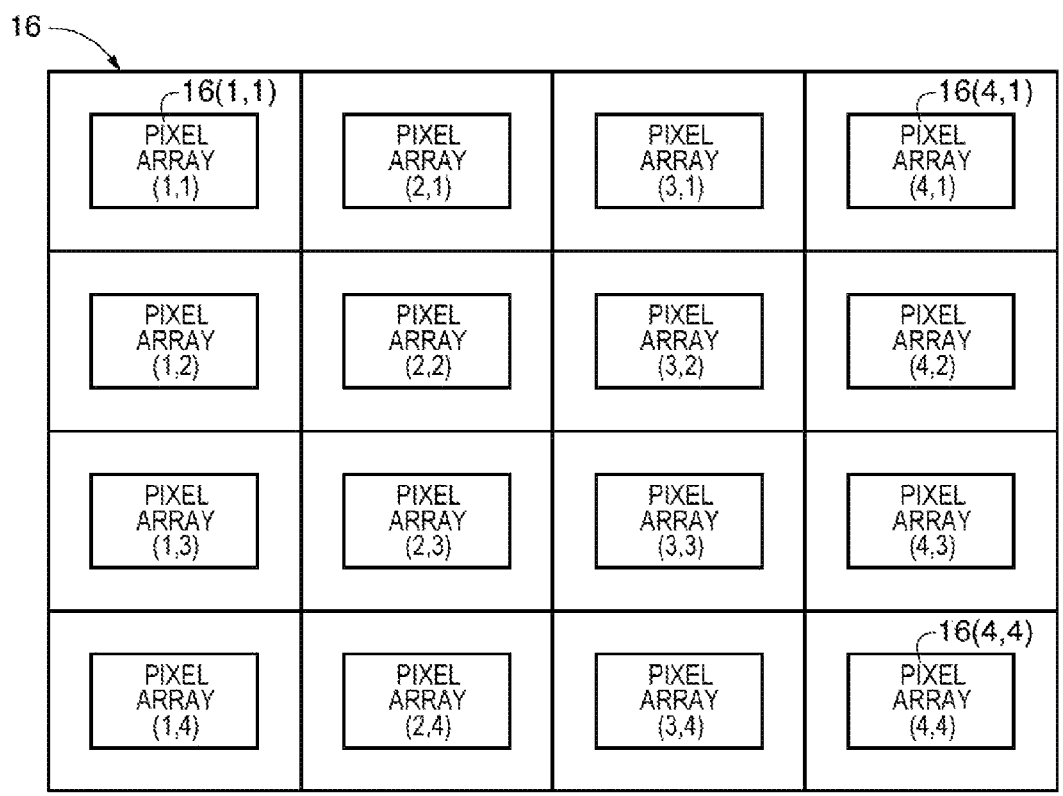
FIG. 3 is a diagram of an illustrative sensor array of the type that may be used with the lens array of FIG. 2 in a camera module in accordance with an embodiment of the present invention.

An illustrative sensor array of the type that may be used with the lens array of FIG. 2 is shown in FIG. 3. As shown in FIG. 3 sensor array 16 may include image sensors such as sensor 16(1,1), 16(4,1), and 16(4,4). The array of FIG. 3 has sixteen image sensors, but, in general, array 16 may have any suitable number of image sensors (e.g., on image sensor, two or more sensors, four or more sensors, ten or more sensors, 20 or more sensors, etc.).

Figure 4:
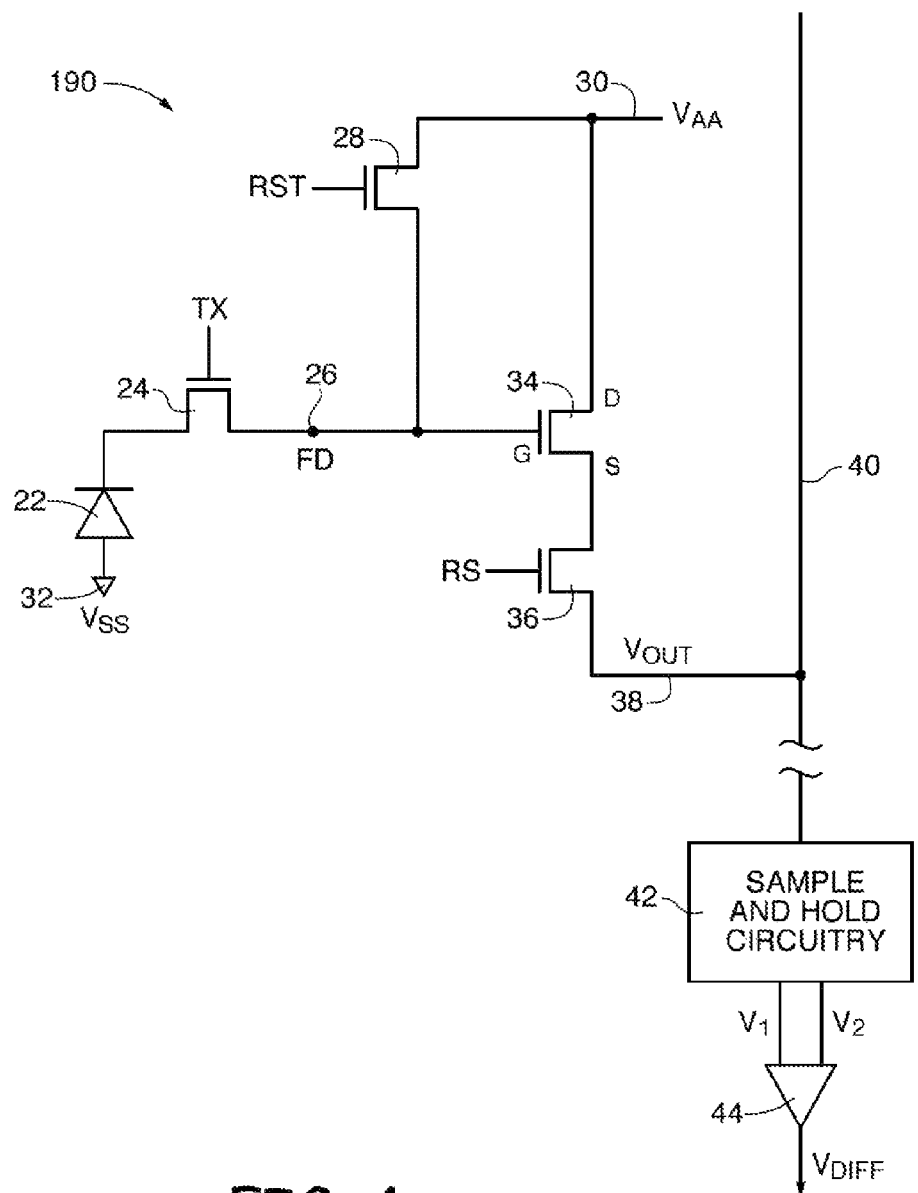
FIG. 4 is a diagram of an illustrative image sensor pixel in accordance with an embodiment of the present invention.

Circuitry in an illustrative pixel of one of the image sensors in sensor array 16 is shown in FIG. 4. As shown in FIG. 4, pixel 190 may include one or more photosensitive elements such as photodiode 22. A positive power supply voltage (e.g., voltage Vaa) may be supplied at positive power supply terminal 30. A ground power supply voltage (e.g., Vss) may be supplied at ground terminal 32. Incoming light may be collected by photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to Vaa. The reset control signal RST may then be deasserted to turn off reset transistor 28. After the reset process is complete, transfer gate control signal TX may be asserted to turn on transfer transistor (transfer gate) 24 and initiate readout operations for imaging data or verification image data. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 22. The signal associated with the stored charge on node 26 is conveyed to row select transistor 36 by source-follower transistor 34.

When it is desired to read out the value of the stored charge (i.e., the value of the stored charge that is represented by the signal at the source S of transistor 34), row select control signal RS can be asserted. When signal RS is asserted, transistor 36 turns on and a corresponding signal $V_{OUT}$ that is representative of the magnitude of the charge on charge storage node 26 is produced on output path 38. $V_{OUT}$ may represent a voltage corresponding to a charge generated by incoming light on photodiode 22, a reset voltage (e.g., for a correlated-double-sampling (CDS) readout of pixel 190), a voltage corresponding to a charge generated by heat, or other voltage.

A vertical conductive path such as path 40 can be associated with each column of pixels. When signal RS is asserted in a given row, path 40 can be used to route signal $V_{OUT}$ from pixels in that row to column readout circuitry. If desired, column readout circuitry may include circuitry such as sample and hold circuitry 42. Sample and hold circuitry 42 may be configured to read and store signals such as signals $V_1$ and $V_2$ (e.g., a voltage corresponding to a pixel reset and a voltage corresponding to integrated charge transferred from the photodiode) from each pixel 190. Signals $V_1$ and $V_2$ may be provided to a differential amplifier such as amplifier 44 in order to provide a differential signal $V_{DIFF}$ to storage and processing circuitry 18 (see FIG. 1). $V_{DIFF}$ may, for example, correspond to the difference between charges generated by incoming light and charges generated by heat produced by verification circuitry associated with an image sensor.

If desired, other types of image pixel circuitry may be used to implement the image pixels of sensors array 16. For example, each image sensor pixel 190 may be a three-transistor pixel, a pin-photodiode pixel with four transistors, a global shutter pixel, a time-of-flight pixel, etc. The circuitry of FIG. 2 is merely illustrative.

Figure 5:
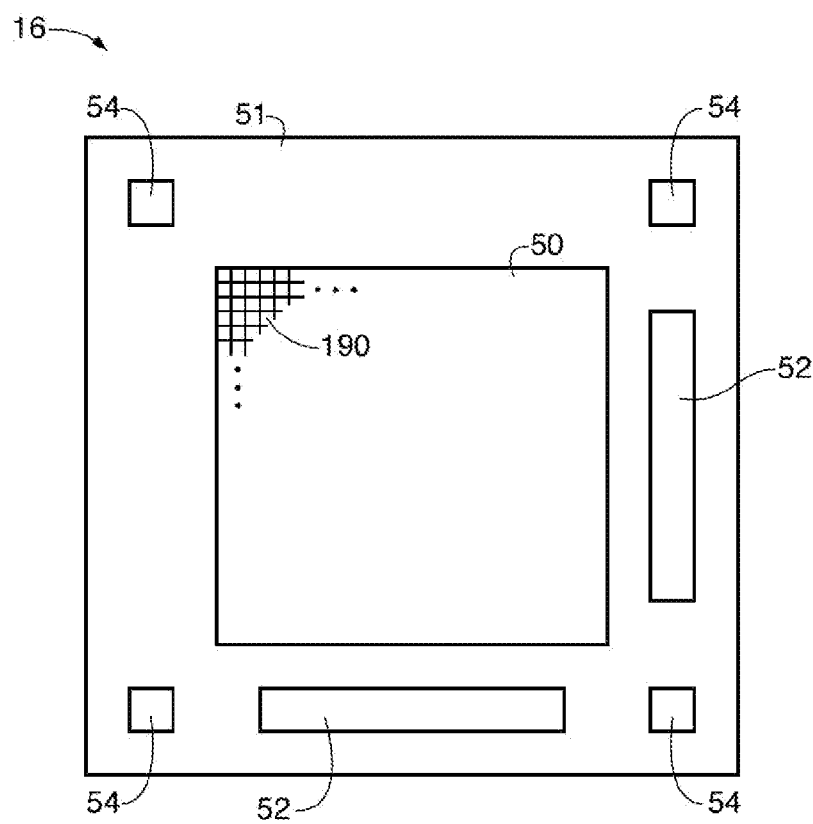
FIG. 5 is a top view of an illustrative image sensor having an image pixel array and verification circuitry in accordance with an embodiment of the present invention.

In a typical configuration, there are numerous rows and columns of pixels such as pixel 190 in the image sensor pixel array of a given image sensor. As shown in FIG. 5 an image sensor such as image sensor 16 may include an array of pixels such as pixel array 50 having a multiple image pixels 190 formed on a substrate 51 (e.g., a silicon image sensor integrated circuit die). Image sensor 16 may include verification circuitry such as heat elements 54 formed on the substrate. Image sensor 16 may include control circuitry such as control circuitry 52 for operating pixels 190 and verification circuitry 54.

Control circuitry 52 may include row control circuitry, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Control circuitry 52 may be formed entirely on substrate 51 or may be formed, in part, or entirely on an additional integrated circuit die.

Heat elements 54 may include one or more resistive elements, one or more transistors, or other suitable elements for generating heat in substrate 51. In the example of FIG. 5, image sensor 16 includes four heat elements 54, one near each corner of pixel array 50. However, this is merely illustrative. If desired, image sensor 16 may have one heat element, two heat elements, three heat elements, or more than four heat elements. Heat elements 54 may be operated by circuitry 52 or circuitry 18 (see FIG. 1).

Heat elements 54 may be operated separately or together. During operation, heat generated in substrate 51 by heat elements 54 may cause photosensitive elements (e.g., photodiodes 22 of FIG. 4) of pixels 190 to generate electrical charges.

Figure 6:
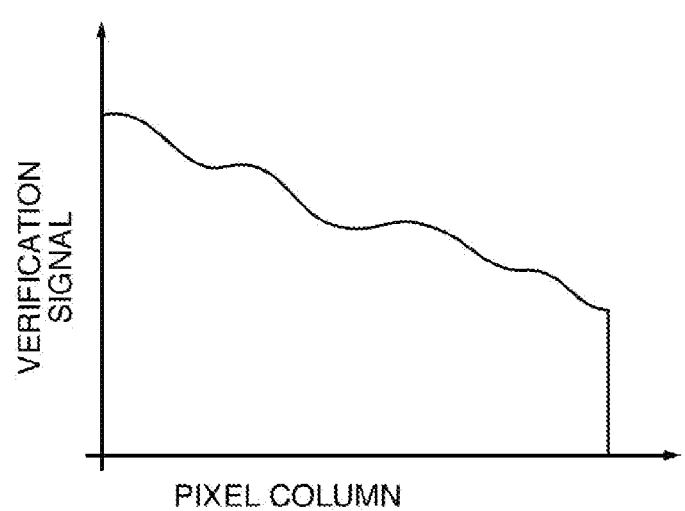
FIG. 6 is a graph showing how verification circuitry of the type shown in FIG. 5 may generate a non-uniform distribution of pixel intensities across an image pixel array in accordance with an embodiment of the present invention.

Charges generated by photodiodes 22 in response to heat from heat elements 54 may generate a non-uniform verification "image" on the pixel array (e.g., a non-uniform distribution of charges on photodiodes 22 of pixels 190). As shown in FIG. 6, the signal generated in each pixel 190 of pixel array 50 in response to heat in substrate 51 from heat elements 54 may vary with the position of a given pixel 190 in array 50.

Heat elements 54 may be provided with sufficient power (e.g., from control circuitry 52) to generate enough verification image charges (verification charges) to be detectable over electrical noise generated by noise sources such as analog-to-digital converter circuitry, signal amplifiers, etc. In one embodiment that is sometimes described herein as an example, heat elements 54 may be provided with as much as 100 milliwatts of power or more.

Verification charges (also called heat charges or heat image charges) generated in response to heat from heat elements 54 and stored on photodiodes 22 of pixels 190 may be read out using circuitry associated with pixel 190 and circuitry 52 in the same way charges generated by incoming light are commonly read out. In this way, verification charges generated by heat elements 54 may be processed by imaging system 10 in the same manner as imaging charges, thereby operating each and every element of pixels 190, circuitry 52 and circuitry 18 for verification purposes.

Verification charges may be processed using circuitry 18 to form verification image data (e.g., pixel values corresponding to the amount of heat received by a given pixel 190 from heat elements 54). Verification image data may be processed on a pixel-by-pixel basis or on a frame-by-frame basis in the form of verification image frames. For example, while heat elements 54 are powered on, a heat image may be captured using image sensor 16. At another time, with heat elements 54 off, a background image of a scene may also be captured and stored (e.g., in a frame buffer associated with circuitry 52 or circuitry 18 of imaging system 10). The heat image may be read out and the background image (captured with heat elements 54 turned off) may be subtracted from the heat image using circuitry 52 or circuitry 18 to remove scene contents from the heat image forming a verification image. The verification image may then be compared to a predetermined standard in order to verify whether image sensor 16 is operating properly.

In another example, background image data may be subtracted from verification image data without using a frame buffer using a correlated-double-sampling style readout of pixels 190. In this example, background image charges may be generated by photodiodes 22 of pixels 190 (with heat elements 54 turned off) and transferred to storage (e.g., the floating diffusion node or an additional storage diode or storage capacitor) within each pixel. With background image charges stored within each pixel, heat elements 54 may be turned on so that heat image charges are generated on photodiodes 22. Heat image charges on the photodiodes and background image charges on the pixel storage may then be read out differentially in a CDS-type readout (e.g., using sample and hold circuitry 42 and comparator 44 of FIG. 4). In this way, a differential verification signal (i.e., a voltage difference) may be provided to circuitry 18 for comparison to the predetermined standard.

If desired, verification image data may be generated with heat elements 54 turned on and a mechanical shutter associated with the image sensor (such as one of the shutters of shutter array 15) closed. In this example, no scene content is added to the heat image (since shutter 15 blocks image light from reaching image sensor 16) and no subtraction of background image information or charges may be necessary.

The predetermined standard may be data stored on circuitry 18. Predetermined standard data may include a "golden" standard verification image (e.g., captured during manufacturing of imaging system 10 or at startup of imaging system 10) generated by operating heat elements 54 and capturing the standard image using image pixels 190. In this example, the comparison of the verification data to the predetermined standard may include a subtraction of the "golden" standard image and the heat image to form a difference verification image. The pixel values in the verification image may be compared with a predetermined range of acceptable values. The result of the comparison may be processed by circuitry 18 of imaging system 10 or may be provided to host subsystem 20. If the pixel values in the difference image fall within the predetermined range of values, imaging system 10 may continue to operate normally. If the pixel values in the difference image fall outside the predetermined range of values, the host subsystem 20 may be configured to disable some or all of imaging system 10 and/or, if desired, issue a warning to the operator of imaging system 10 (e.g., the driver of an automobile including system 100).

The example of a "golden" standard image is merely illustrative. If desired, the predetermined standard may include verification image data captured during a previous operation of heat elements 54, may include a mathematical predicted value for verification image signal values for some or all pixels 190 of pixel array 50 (e.g., based on known properties of substrate 51, heat elements 54 and pixels 190), may include a statistical range of pixel values, or may include other suitable standard data for verifying proper operation.

If desired, verification image data may be processed by storage and processing circuitry 18 prior to comparison of the verification image data with the predetermined standard. For example, storage and processing circuitry 18 may be configured to apply filtering such as noise filtering to the verification image data (e.g., time-domain filtering, frequency-domain filtering, or spatial filtering of stored verification images). Applying a noise filter to the verification image data prior to comparison with the predetermined standard may help improve the reliability and simplicity of the comparison with the predetermined standard.

If desired, verification image data may be accumulated during multiple heat image captures (i.e., collection of charges using photodiodes 22 while heat elements 54 are powered on). Multiple heat image captures may include multiple integrations of charge with heat elements 54 powered on and multiple integrations of charge with heat elements 54 powered off. Heat images may be captured with one of heat elements 54, powered on and other heat elements 54 powered off or may be captured with all of heat elements 54 powered on.

Figure 7:
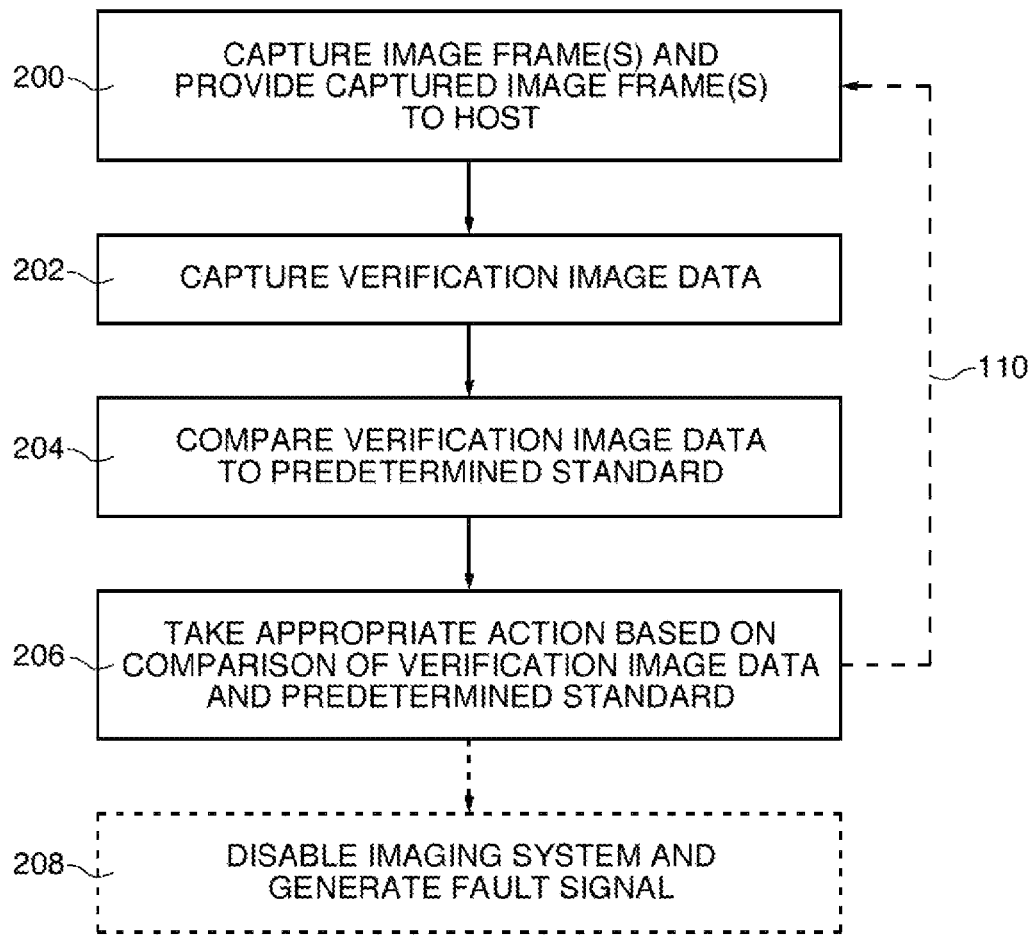
FIG. 7 is a flowchart of illustrative steps that may be used for continuous on-the-fly verification of imaging systems of the type shown in FIG. 1 in accordance with an embodiment of the present invention.

FIG. 7 is a flowchart showing illustrative steps that may be used in operating a system such as an imaging and response system of the type shown in FIG. 1.

At step 200, an imaging system such as imaging system 10 of FIG. 1 may be used to capture one or more image frames. Some or all of the captured image frames may be provided to a host such as host subsystem 20 of FIG. 1. If desired, image frames may be processed using storage and processing circuitry 18 to process the image frames prior to delivery to host subsystem 20. If desired, image frames may be continuously captured, processed, and provided to host 20 (e.g., as part of a vehicle safety system such as an active control system).

At step 202, in order to verify proper operation of all components of imaging system 10, imaging system 10 may be used to capture verification image data. Verification image data may be generated, in part, by powering on one or more heat elements formed on a common substrate with image pixels of the image sensor and collecting charges generated in response to heat in the substrate produced by the heating elements.

At step 204, the verification image data may be compared to a predetermined standard such as a "golden" standard image or a mathematically or experimentally determined threshold or range.

At step 206, system 100 may take appropriate action based on the result of the comparison of the verification image data with the predetermined standard. If the verification data is determined to be within a tolerable range of the predetermined standard, system 100 may return to step 200 (as indicated by dashed line 110) and resume the cycle of image capture and imaging system verification during the remaining operation of system 100. If the verification data is determined to be outside the tolerable range of the predetermined standard, system 100 may progress to step 208.

At optional step 208, host subsystem 20 may disable some or all of imaging system 10 and, if desired, generate a fault signal such as an audible or visible failure alert signal for an operator of system 100 (e.g., an operator of a vehicle including a vehicle safety system such as system 100). In some arrangements, imaging system 10 may remain in operation but an indicator may be presented to the operator to inform the operator that the imaging system needs further inspection and/or repair (e.g., the imaging system may present a "check imaging system" indication when the results of verification operations indicate a potential problem in the operation of the imaging system).

Figure 8:
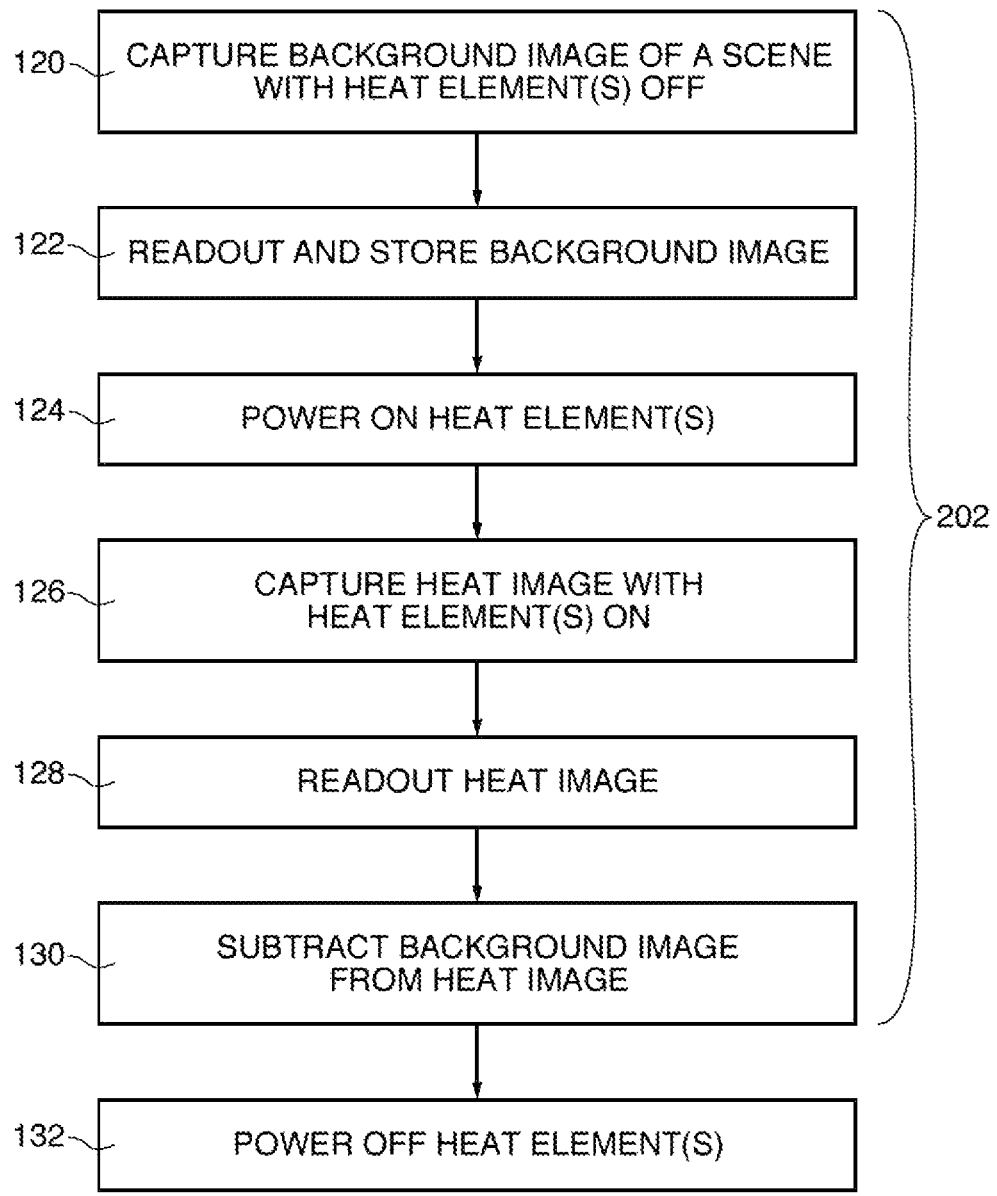
FIG. 8 is a flowchart of illustrative steps that may be used in generating verification image data using a frame buffer in accordance with an embodiment of the present invention.

FIG. 8 is a flowchart showing illustrative steps that may be used in capturing verification image data as described above in connection with step 202 of FIG. 7 using frame storage such as a frame buffer to store a background image.

At step 120, a background image of a scene may be captured by integrating charges with photodiodes 22 of image pixels 190 while heat elements 54 are turned off and incoming light from the scene is allowed to reach photodiodes 22.

At step 122, the background image may be readout and stored in, for example, a frame buffer associated with circuitry 52, or circuitry 18 of imaging system 10.

At step 124, heat elements 54 may be powered on.

At step 126, a heat image may be captured by integrating charges with photodiodes 22 of image pixels 190 while heat elements 54 are powered on. In this example, a heat image may include information corresponding to heat from heat elements 54 and information corresponding to the incoming light from the scene.

At step 128, the heat image may be read out and provided to storage and processing circuitry 18.

At step 130, scene information may be removed from the heat image by subtracting the stored background image from the heat image using circuitry 52 or storage and processing circuitry 18 to form a verification image. The verification image may then be used as verification image data for comparison to the predetermined standard as described above in connection with step 202 of FIG. 7.

At step 132, heat elements 54 may be powered off.

Figure 9:
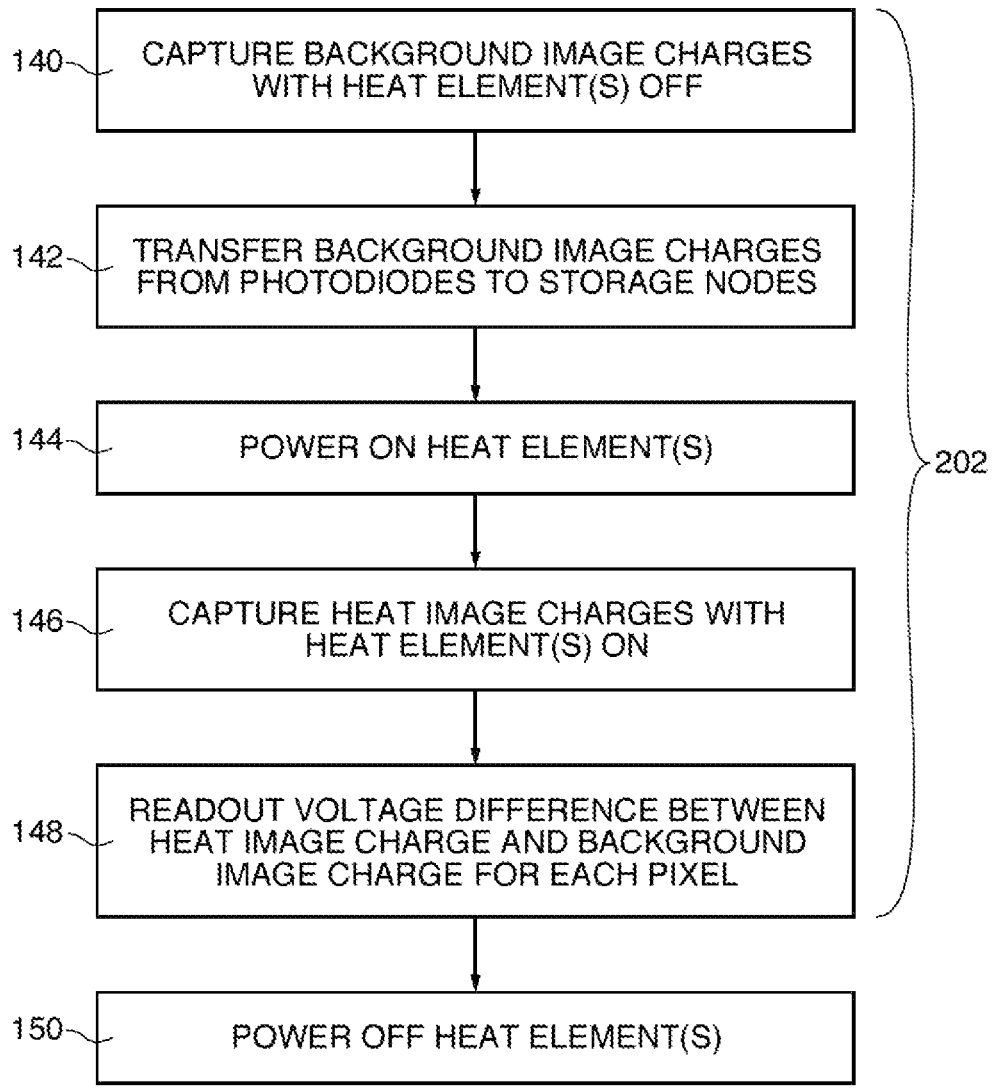
FIG. 9 is a flowchart of illustrative steps that may be used in generating verification image data using a differential signal in accordance with an embodiment of the present invention.

FIG. 9 is a flowchart showing illustrative steps that may be used in capturing verification image data as described above in connection with step 202 of FIG. 7 using a CDS-type capture and readout.

At step 140, background image charges may be integrated on photodiodes 22 of image pixels 190 while heat elements 54 are turned off and incoming light from the scene is allowed to reach photodiodes 22.

At step 142, the background image charges on photodiode 22 of each pixel 190 may be transferred to a storage region such as a floating diffusion region or a storage diode in that pixel 190.

At step 144, heat elements 54 may be powered on.

At step 146, heat image charges may be integrated on photodiodes 22 of image pixels 190 while heat elements 54 are powered on. In this example, heat image charges may include charges generated by heat from heat elements 54 and by incoming light from the scene.

At step 148, the verification image data may be generated by reading out the heat image charges stored on photodiodes 22 and the background image charges stored on the storage regions of each pixel in a CDS-type readout. The CDS-type readout may include sampling and holding the background image charges and sampling and holding the heat image charges using sample and hold circuitry such as sample and hold circuitry 42 of FIG. 4 and generating a differential voltage signal (e.g., $V_{DIFF}$) from each pixel 190 to be provided to storage and processing circuitry 18. The differential voltage signal $V_{DIFF}$ from pixels 190 may then be used as verification image data for comparison to the predetermined standard as described above in connection with step 202 of FIG. 7.

At step 150, heat elements 54 may be powered off.

Figure 10:
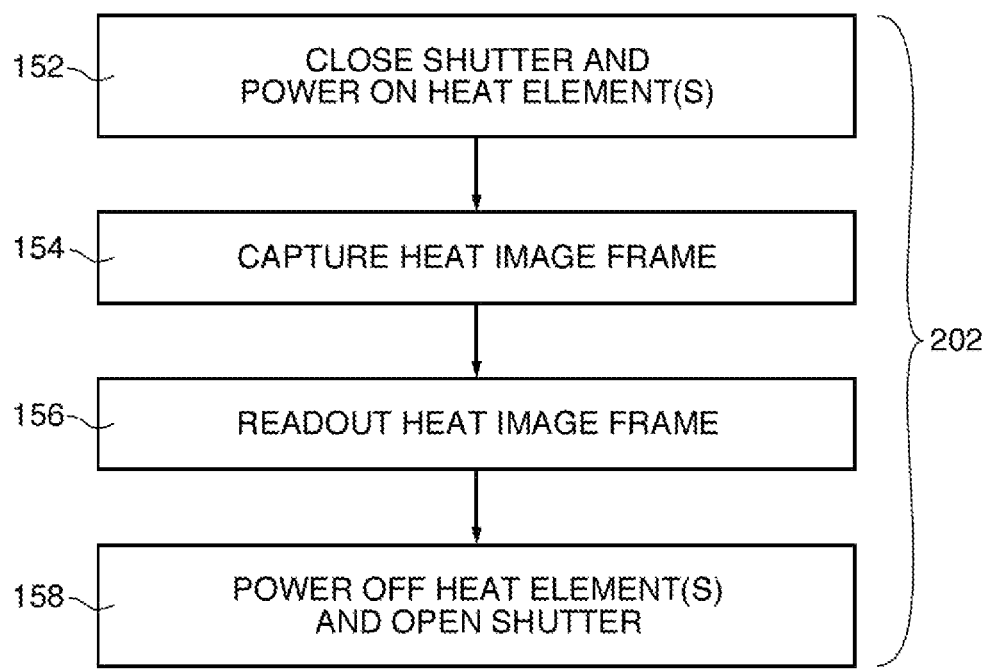
FIG. 10 is a flowchart of illustrative steps that may be used in generating verification image data using a mechanical shutter in accordance with an embodiment of the present invention.

FIG. 10 is a flowchart showing illustrative steps that may be used in capturing verification image data as described above in connection with step 202 of FIG. 7 using a mechanical shutter.

At step 152, a mechanical shutter (see, e.g., shutters 15 of FIG. 2) may be closed and heat elements 54 may be powered on. The mechanical shutter may (in the closed position) be configured to block image light from reaching photodiodes 22 of pixels 190.

At step 154, a heat image may be captured by integrating charges with photodiodes 22 of image pixels 190 while heat elements 54 are powered on and shutter 15 is closed.

At step 156, the heat image may be read out and provided to storage and processing circuitry 18.

At step 158, heat elements 54 may be turned off and shutter 15 may be opened. The heat image generated at step 158 may then be used as verification image data for comparison to the predetermined standard as described above in connection with step 202 of FIG. 7.

Various embodiments have been described illustrating an imaging and response system (see, e.g., system 100 of FIG. 1) including an imaging system and host subsystems. An imaging system may include one or more image sensors. Each image sensor may include one or more corresponding lenses and one or more corresponding mechanical shutters. Each image sensor may include an array of image pixels formed on a substrate. Each image pixel may include one or more photosensitive elements configured to convert incoming light and/or heat into electric charges.

Each image sensor may include one or more heating elements (heat elements) formed on the substrate that generate non-uniform heating of the substrate. The photosensitive elements may generate electric charges in response to the heat generated in the substrate by a heating element.

A heating element may include one or more resistive elements (resistors), one or more transistors, or other suitable heat generating circuitry. Heating elements may be formed on opposing sides of an array of image pixels on the substrate, may be formed near enough to a corner of the array of image pixels to heat the portion of the substrate having image pixels, or may be otherwise located in the imaging system.

An image sensor may include control circuitry formed on the substrate that is configured to operate the image pixels and the heating elements. An image sensor may have multiple operational modes. For example, in one operational mode the control circuitry may operate the image sensor to capture images of a scene using the image pixels. In another operational mode, the control circuitry may power on the heating elements and operate the image pixels to capture heat image data.

The imaging and response system may include a host subsystem coupled to the imaging system. The imaging system and the host subsystem may each include storage and processing circuitry. Storage and processing circuitry associated with the imaging system and/or the host subsystem may process and store image data, verification image data, predetermined standard data (also sometimes referred to as verification-standard data) or other data. The host subsystem may be configured to generate a response (e.g., to actively brake an automobile, to activate an audible or visible warning signal, etc.) based on scene content in images that have been received from the imaging system.

The processing circuitry of the imaging system may be configured to perform a comparison of the heat image data to the verification-standard data to verify proper operation of the imaging system. The host subsystem may be configured to receive a result of the comparison of the heat image data to the verification-standard data.

A host subsystem may be a portion of a vehicle safety system such as an active control system and that is configured to redirect the automobile to avoid a collision with an object in the images.

During operation of the imaging system, image frames may be captured and provided to the host subsystem. Verification image data may be occasionally collected by the imaging system during operation of the imaging system (e.g., between image frames, after a selected number of image frames, during an image frame or at any other suitable interval). During collection of verification image data, control circuitry on the substrate may power on a heating element. With the heating element powered on, the image pixels may be used to capture the heat image data generated in response to the heat from the powered heating element.

The captured verification image data may be generated from the heat image data and may then be compared with a predetermined standard stored on the storage and processing circuitry. The result of the comparison may then be provided to external circuitry such as the host subsystem.

According to one example, capturing the verification image data may include capturing a background image of a scene, storing the background image of the scene on the storage and processing circuitry, powering on the heating element, capturing a heat image with the heating element powered on, reading out the heat image from the image pixels to the storage and processing circuitry, subtracting the background image of the scene from the heat image to form a verification image and powering off the heating element.

According to another example, capturing the verification image data may include collecting background image charges generated on photosensitive elements of the image pixels in response to incoming light, transferring the background image charges from the photosensitive element of each image pixel to the charge storage region of that image pixel, powering on the heating element, collecting heat image charges generated on the photosensitive elements in response to heat from the powered heating element, reading out a voltage difference from each image pixel that corresponds to a difference between the heat image charges on the photosensitive element and the background image charges on the storage region of that pixel (e.g., using a CDS-type readout operation using sample and hold circuitry) and powering off the heating element.

Each image sensor may have an associated mechanical shutter that is configured to block incoming light from reaching the image pixels when the mechanical shutter is closed. In configurations in which the imaging system is provided with a mechanical shutter, capturing the verification image data may include closing the mechanical shutter in order to block incoming light from reaching the image pixels, powering on the heating element, capturing at least one heat image frame, and reading out the at least one heat image frame from the image pixels to the storage and processing circuitry.

Based on the result of the comparison of the captured verification image data with the predetermined standard, external circuitry such as the host subsystem may continue normal operation of the imaging system (e.g., if the result is within an acceptable range), generating a warning signal (e.g., if a fault signal is generated with the result because the result is outside of an acceptable range), disable the imaging system (e.g., if the result indicates a significant problem with the imaging system), or may take other appropriate action based on the result.

The foregoing is merely illustrative of the principles of this invention which can be practiced in other embodiments.

What is claimed is:

1. An image sensor, comprising:
   a substrate;
   an array of image pixels formed on the substrate, wherein each image pixel includes a photosensitive element configured to convert incoming light into electric charges; and
   a heating element formed on the substrate, wherein the heating element is configured to generate heat in the substrate and wherein the photosensitive elements are configured to generate additional electric charges in response to the heat generated in the substrate by the heating element; and
   circuitry configured to capture a heat image using the array of image pixels while the heat is generated in the substrate, wherein the circuitry is further configured to compare the heat image with a predetermined image to determine whether the image sensor is operating properly.

2. The image sensor defined in claim 1 wherein the heating element comprises a resistor formed on the substrate.

3. The image sensor defined in claim 1 wherein the heating element comprises a transistor formed on the substrate.

4. The image sensor defined in claim 1, further comprising at least one additional heating element formed on the substrate, wherein the at least one additional heating element is configured to generate additional heat in the substrate, and wherein the photosensitive elements are configured to generate further additional electric charges in response to the additional heat generated in the substrate by the at least one additional heating element.

5. The image sensor defined in claim 4 wherein the heating element and the at least one additional heating element are configured to non-uniformly heat the substrate.

6. The image sensor defined in claim 4 wherein the array of image pixels is formed between the heating element and the at least one additional heating element on the substrate.

7. The image sensor defined in claim 1, further comprising control circuitry formed on the substrate, wherein the control circuitry is configured to operate the image pixels and the heating element.

8. The image sensor defined in claim 7 wherein the control circuitry is configured to deliver at least 100 milliwatts of power to the heating element during operation of the heating element.

9. An imaging and response system, comprising:
- an imaging system having control circuitry, a plurality of image pixels, and a heating element, wherein the control circuitry is configured to operate the image sensor to capture an image of a scene using the image pixels in a first operational mode and wherein the control circuitry is configured to power on the heating element and operate the image pixels to capture a heat image in a second operational mode; and
- a host subsystem having storage and processing circuitry, wherein the storage and processing circuitry is configured to compare the image of the scene to the heat image to determine whether the system is operating properly.

10. The imaging and response system defined in claim 9 wherein the host subsystem is configured receive a result of the comparison of the image of the scene to the heat image.

11. The imaging and response system defined in claim 10 wherein the host subsystem is configured to generate a response to scene content in the images that have been received from the imaging system.

12. The imaging and response system defined in claim 11 wherein the host subsystem comprises a portion of a vehicle safety system and wherein the response to the scene content includes an audible alarm.

13. The imaging and response system defined in claim 12 wherein the host subsystem comprises a portion of an active control system for an automobile, and wherein the active control system is configured to redirect the automobile to avoid a collision with an object in the images.

14. A method of operating an imaging system having storage and processing circuitry, at least one image sensor that includes image pixels and a heating element, and at least one mechanical shutter configured to block incoming light from reaching the image pixels when the mechanical shutter is closed, the method comprising:
- with the image pixels, capturing verification image data generated in response to heat from the heating element by:
  - closing the mechanical shutter in order to block incoming light from reaching the image pixels;
  - powering on the heating element;
  - while the mechanical shutter is closed and while the heating element is powered on, capturing at least one heat image frame with the image pixels; and
  - reading out the at least one heat image frame from the image pixels to the storage and processing circuitry;
- with the storage and processing circuitry, comparing the captured verification image data with a predetermined standard stored on the storage and processing circuitry; and
- providing a result of the comparison of the captured verification image data with the predetermined standard to external circuitry.

15. The method defined in claim 14, further comprising:
- with the image pixels, prior to capturing the verification image data, capturing at least one image frame; and
- providing the at least one image frame to the external circuitry.

16. The method defined in claim 14 wherein the result of the comparison of the captured verification image data with the predetermined standard includes a fault signal, the method further comprising:
- with the external circuitry, generating a warning signal based on the fault signal.

17. The method defined in claim 16, further comprising:
- with the external circuitry, disabling the imaging system.

* * * * *